United States Patent [19]
Man

[11] Patent Number: 5,449,578
[45] Date of Patent: Sep. 12, 1995

[54] METHOD OF MANUFACTURING A MASK FOR FORMING A PATTERN IN A SEMICONDUCTOR DEVICE

[75] Inventor: Bae S. Man, Seoul, Rep. of Korea

[73] Assignee: Hyundai Electronics Industries Co., Ltd., Kyungki, Rep. of Korea

[21] Appl. No.: 257,252

[22] Filed: Jun. 8, 1994

[30] Foreign Application Priority Data

Jun. 10, 1993 [KR] Rep. of Korea .................. 93-10486

[51] Int. Cl.$^6$ .............................................. G03F 9/00
[52] U.S. Cl. ........................................ 430/5; 430/322; 430/316; 430/323; 430/326; 428/432
[58] Field of Search ................... 430/5, 316, 322, 323, 430/326; 428/432

[56] References Cited

U.S. PATENT DOCUMENTS 5,279,911 1/1994 Kamon et al. ........................ 430/5

Primary Examiner—S. Rosasco
Attorney, Agent, or Firm—Pennie & Edmonds

[57] ABSTRACT

A method of manufacturing a mask for forming a pattern in a semiconductor device is disclosed. Material having high reflexibility is formed between a quartz substrate and a patterned chromium layer. The thickness of the quartz substrate is determined in consideration of the standing wave effect so as to use energy reflected off a patterned chromium layer and re-reflected off the quartz substrate base interface to augment direct, non-reflected light energy for the purpose of forming an image on a wafer. Accordingly, the amount of light exposed energy through gaps between adjacent chromium layer areas on the mask is increased during the formation of a micro pattern on the wafer. As a result, energy exposure time decreases and the depth of the focus increases.

3 Claims, 4 Drawing Sheets

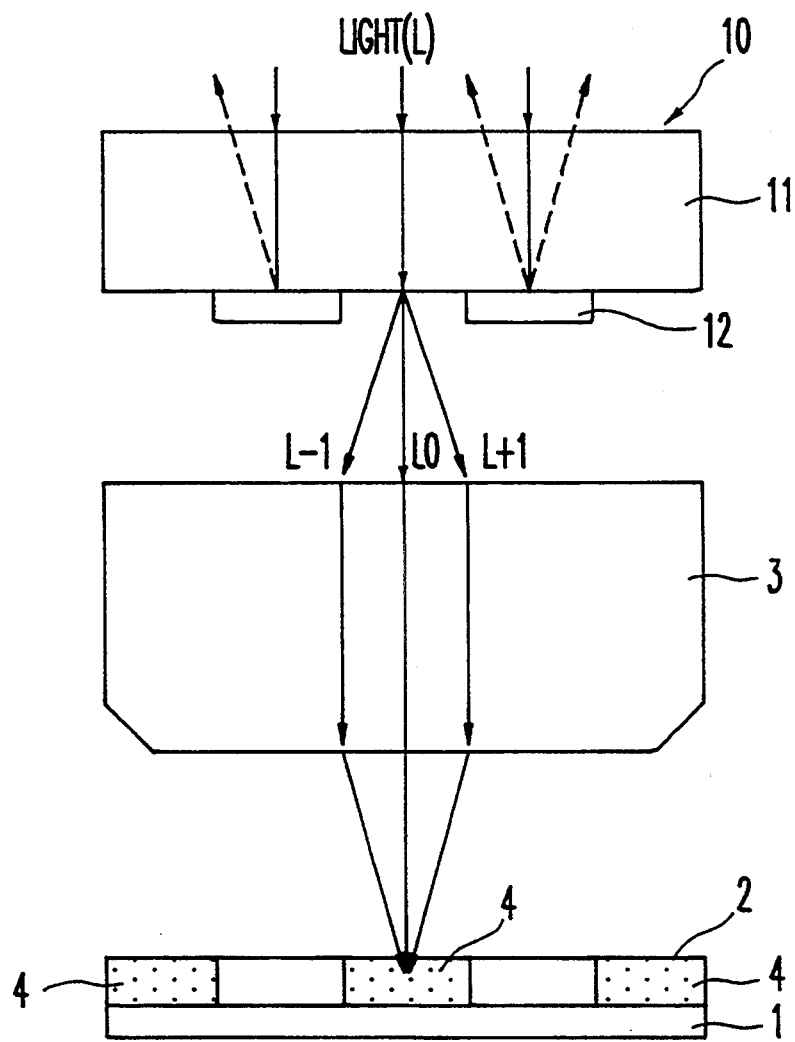

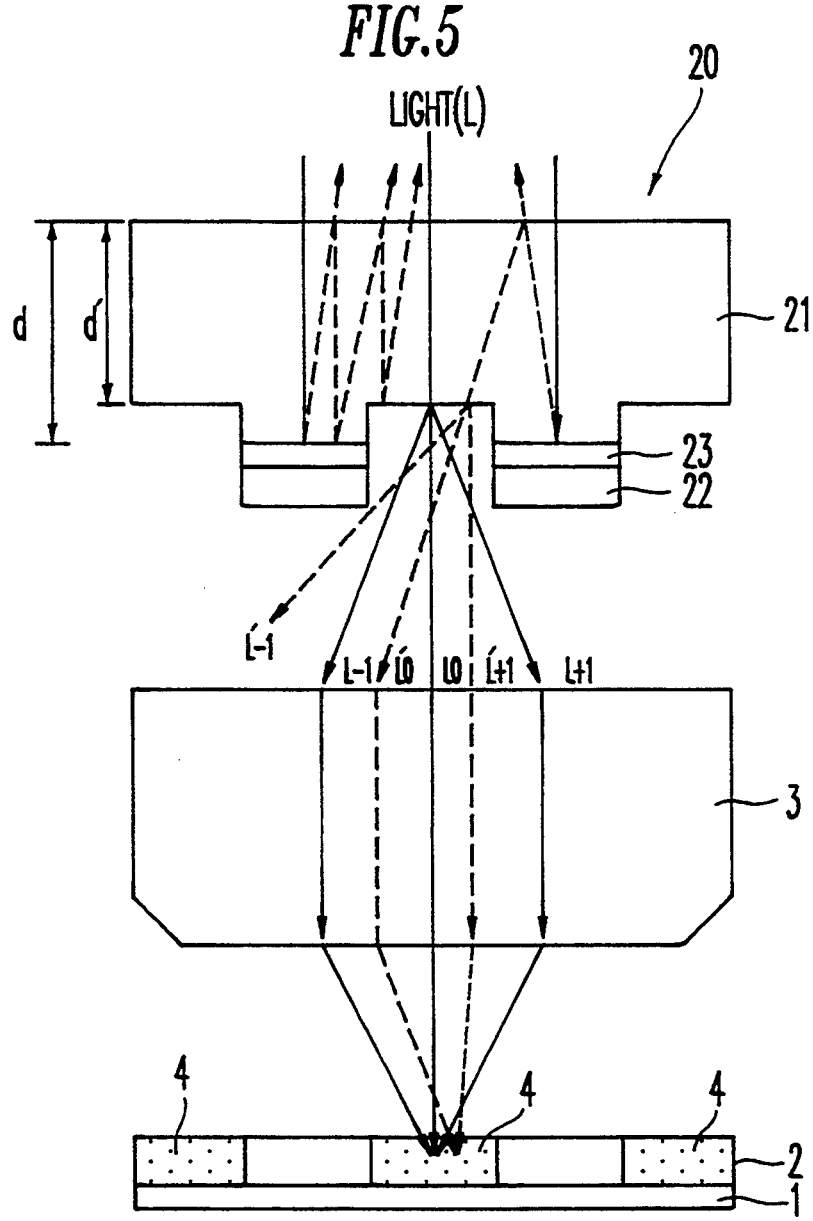

METHOD OF MANUFACTURING A MASK FOR FORMING A PATTERN IN A SEMICONDUCTOR DEVICE

FIELD OF THE INVENTION

This invention relates to a method of manufacturing a mask for forming a pattern in a semiconductor device which is used in the optical lithography process for making a semiconductor device, and more particularly, to a method of manufacturing a mask for forming a pattern in a semiconductor device in such a way that the exposure energy on the light-transmitted portion of a pattern closely formed on the mask increases when a micro pattern is formed on a wafer.

INFORMATION DISCLOSURE STATEMENT

Generally under the prior art, a stepper is used to form a pattern on the wafer. A conventional mask is used in the stepper. A pattern is closely formed on the mask to form a micro pattern. Typically as a result of this process, light energy from the stepper light source is not sufficiently transmitted to the photoresist on the wafer through the mask.

In other words, transmission of light energy by an image of the pattern formed on the mask to the photoresist on the wafer is impeded because of light deflection and light interception phenomena caused by the pattern on the mask. To remedy this problem the exposure energy must be increased to overcome such phenomena.

FIG. 1 illustrates a cross sectional view of the stepper to explain the exposure process using the conventional mask. As shown in FIG. 1, a photoresist 2 is formed on the wafer 1. In order to expose a portion 4 on the photoresist 2, a mask 10 on which a chromium pattern 12 is formed under a quartz substrate 11, and an object lens 3 are applied to the photoresist 2.

That is, the light interception phenomenon (represented by a dotted line in FIG. 1) causes illuminated light from the stepper light source (not shown) to disappear by means of reflection off the chromium pattern; deflected light and light transmitted on areas of the quartz substrate 11 between the chromium layer formations is dissolved and transmitted to zero(0) order transmitted light(L0), positive(+) first order transmitted light(L+1) and negative(−) first order transmitted light(L−1). The transmitted light(L0, L+1 and L−1) is illuminated on the photoresist 2 through the object lens 3, and thereby forming the exposed portion 4 on the photoresist 2. The transmitted light(L0, L+1 and L−1) affects the aerial image intensity, thereby decreasing not only the dissolution ability but also the depth of focus.

On the other hand, the lower the intensity of the positive(+) first order transmitted light and the negative(−) first order transmitted light in comparison with that of the zero order transmitted light, the better the dissolution ability.

An object of the present invention is to solve these above mentioned problems.

A further object of the present invention is to provide a method for depositing materials having high reflecting intensity between the quartz substrate and chromium pattern.

A further object of the present invention is to provide a method for determining the appropriate thickness of the quartz substrate in consideration of the standing wave effect.

SUMMARY OF THE INVENTION

To accomplish the above objects and other advantages the process according to the present invention is comprised of the following steps:

Sequentially forming a reflecting layer and a chromium layer on a quartz substrate;

Depositing a photoresist on the chromium layer and patterning the photoresist;

Etching the chromium layer and the reflecting layer to follow the pattern of the photoresist; and Etching an exposed portion of the quartz substrate and removing the photoresist.

The pertinent and important features of the present invention have been outlined above in order to provide a better understanding of the invention. Additional features of the invention described hereinafter further elaborate the claims of the invention. Those skilled in the art can appreciate that the concept and specific embodiment disclosed herein may be readily used as a basis for modifying its structures to accomplish the same purpose of the present invention. Furthermore, those skilled in the art can recognize that such equivalent constructions do not depart from the spirit and scope of the invention as set forth in the claims.

BRIEF DESCRIPTION OF THE DRAWINGS

For a fuller understanding of the nature and objects of the invention, reference should be had to the following detailed description taken in conjunction with the accompanying drawings in which:

FIG. 1 illustrates a cross sectional view of the stepper to explain an exposure process using a conventional mask;

FIG. 5 illustrates a cross sectional view of the stepper explaining an exposure process using the mask according to the present invention.

Similar reference characters refer to similar parts through the several views of the drawings.

DETAILED DESCRIPTION OF THE INVENTION

FIG. 2A through FIG. 2D illustrate cross sectional views showing the steps of mask manufacturing for a pattern in a semiconductor device according to the present invention.

Figure 2A:
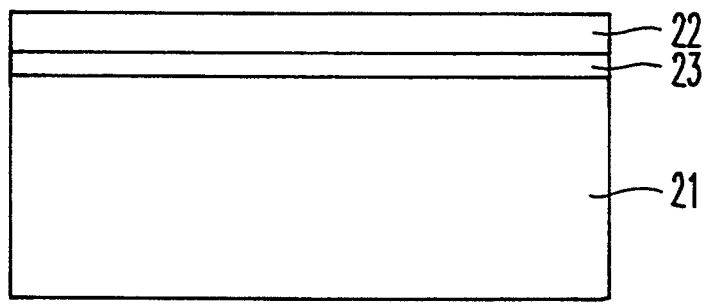
FIG. 2A through FIG. 2D illustrate cross sectional views showing the steps of mask manufacturing of a pattern in a semiconductor device according to the present invention.

Referring to FIG. 2A, a reflecting layer 23 and a chromium layer 22 is sequentially formed on a quartz substrate 21. The reflecting layer 23 is formed, for example, by application of a thin layer of aluminum or silver film having high reflexibility.

Figure 2B:
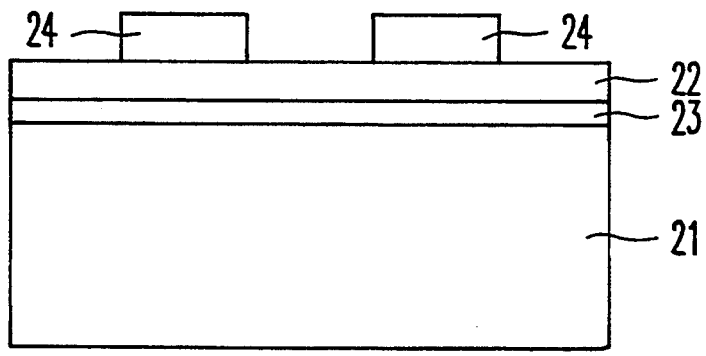

Referring to FIG. 2B, a photoresist 24 is formed on the chromium layer 22 and then the photoresist 24 is patterned to a desired width.

Figure 2C:
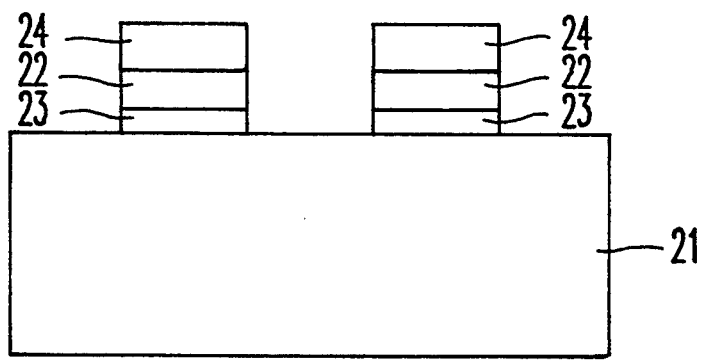

FIG. 2C illustrates the formation in which the chromium layer 22 and the reflecting layer 24 become exposed by etching into such layers following the pattern of the photoresist 24.

Figure 2D:
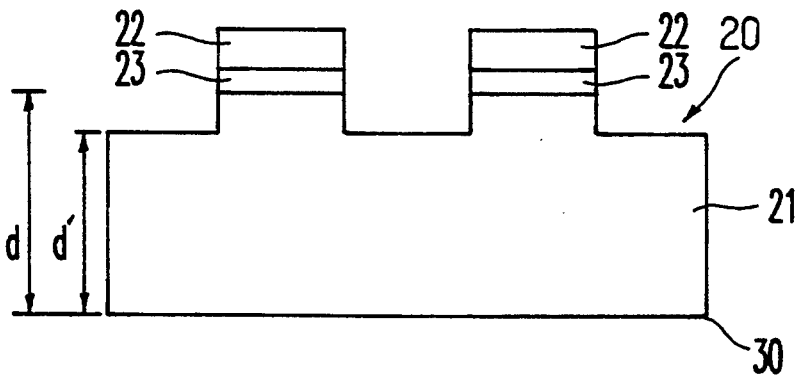

Referring to FIG. 2D, a portion of the quartz substrate 21 is exposed by following the etching pattern of the chromium layer 22 and the reflecting layer 23 to a desired depth; the photoresist 24 is then removed by the conventional method, thereby forming a mask according to the present invention. An exposed portion of the quartz substrate 21 is etched to a desired depth in consideration of the standing wave effect.

It is noted in the process described in connection with FIG. 2A through FIG. 2D that the reflecting layer 23 is formed between the quartz substrate 21 and chromium layer 22.

It is also important to define the thickness of the quartz substrate 21, i.e., it is important that the total thickness "d" of the quartz substrate 21, and the smaller thickness "d'" extending from the base of the quartz substrate 21 to the an etched portion of the quartz substrate 21, are defined.

Since the total thickness "d" and the thickness "d'" are defined, the etching depth of the exposed portion of the quartz substrate 21 as shown in FIG. 2D is determined as "d-d'".

Figure 3A:
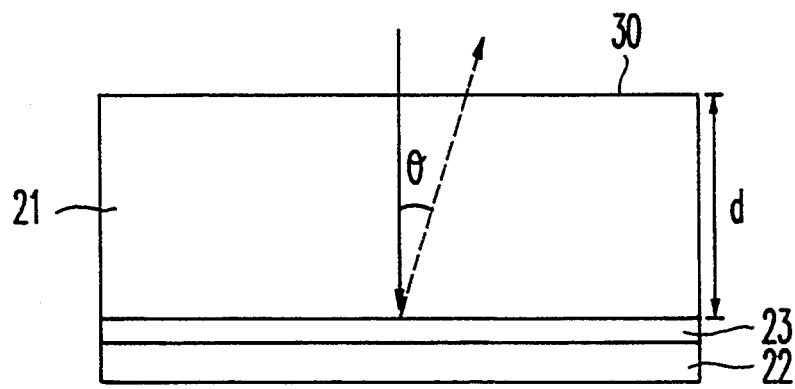
FIG. 3A and FIG. 3B illustrate cross sectional views explaining the intensity of reflected light to incident light according to the thickness of a quartz substrate.
Figure 3B:
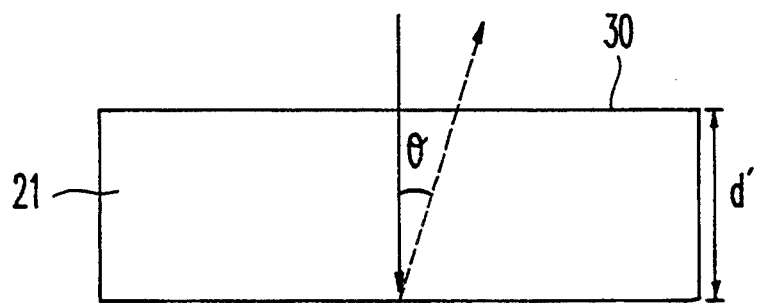
Figure 4:
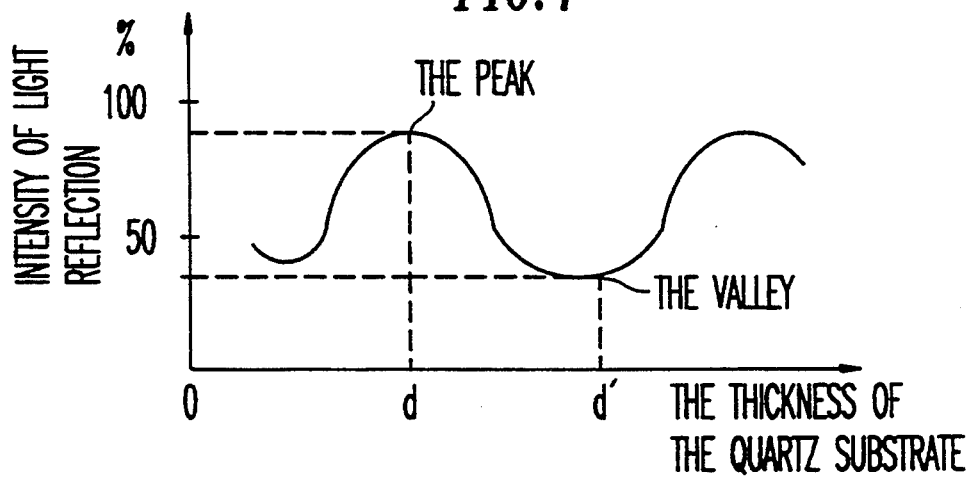
FIG. 4 illustrates a graph explaining the intensity of reflected light according to the thickness of the quartz substrate.

FIG. 3A, FIG. 3B and FIG. 4 explain the definition of the thickness of the quartz substrate.

FIG. 3A and FIG. 3B illustrate cross sectional views to explain the intensity of reflected light to incidental light according to the thickness of the quartz substrate. FIG. 4 illustrates a graph explaining intensity of reflected light according to the thickness of the quartz substrate.

The definition of the thickness "d" of the quartz substrate is explained by referring to FIG. 3A. When light from the stepper light source is illuminated on the quartz substrate 21, the relationship between wave length of light reflected through a boundary 30 of the quartz substrate 21 with the reflecting layer 23, and the thickness of the quartz substrate 21 must satisfy the following requirement:

$$d \cdot \sin \theta = \frac{1}{2} \cdot (2n-1) \cdot \lambda \quad (1)$$

where, d is the thickness of the quartz substrate between the reflecting layer and the external boundary of the quartz substrate;
$\lambda$ is the wavelength;
$\theta$ is the angle of reflection of reflected light; and
n is a positive number.

The definition of the thickness "d'" of the quartz substrate is explained by reference to FIG. 3B.

When light from the stepper light source is illuminated on the quartz substrate 21, the relationship between the wave length of light reflected through the boundary 30 where the quartz substrate 21 meets the base thereof and the thickness of the quartz substrate 21 must satisfy the following requirement:

$$d' \cdot \sin \theta = \frac{1}{2} \cdot (2n-1) \cdot \lambda \quad (2)$$

$\lambda$ is the wavelength;
where, $\theta$ is the angle of reflection of reflected light
d' is the thickness of the quartz substrate at gaps between adjacent areas of the reflecting layer; and
n is a positive number.

That is, as shown in FIG. 4 the intensity of high reflection varies according to the thickness of the quartz substrate. Hence, the quartz substrate must be formed so as to maximize intensity of light reflection at thickness "d" (the peak in FIG. 4) and a minimum intensity of light reflection at thickness "d'" (the valley in FIG. 4).

FIG. 5 illustrates a cross sectional view of the stepper explaining the exposure process using the mask according to the present invention.

FIG. 5 shows the increased energy exposure provided by the present invention of non-reflected light transmitted through mask pattern during the formation of the micro pattern on the wafer 1.

The illuminated light(L) transmitted through gaps between the reflecting layers and then is diffused into zero order transmission light(L0), positive(+) first order transmission light(L+1) and negative(−) first order transmission light(L−1), respectively, and, after passing through the object lens 3, thereby exposing a portion 4 of the photoresist 2.

The illuminated light(L) also reflects off the reflecting layer 23. A portion of the light reflected off the reflecting layer 23 diffuses out of the quartz substrate 21. However, a great portion of the light reflected off the reflecting layer 23 is again reflected off the external edge of the quartz substrate 21 back towards the etched surface of the mask 20 by means of the standing wave effect. Such re-reflected light is then transmitted to a gap between adjacent areas of the reflecting layer 23 and thereby further diffused to the zero order transmission light(L'0), the positive first order transmission light(L'+1) and the negative first order transmission light(L'−1) (represented by dotted lines in FIG. 5), respectively. As a result, a portion 4 of the photoresist 2 is also exposed by the light(L'0, L'+1 and L'−1) after passing through the object lens 3. Therefore the light intercepted and reflected by the chromium pattern is induced to pass through the chromeless gaps, thereby increasing the exposure energy of the light transmitted through such gaps formed by the etching of the mask.

The thickness of the gap areas on the quartz substrate between adjacent areas of the chromium patterned layer is formed such that the standing wave effect is minimized whereas the thickness of the areas of the quartz substrate upon which the chromium pattern is formed such that the standing wave effect is maximized.

As described above, according to the present invention, materials having a high intensity of light reflexibility are formed between the quartz substrate and the chromium pattern; further, the thickness of the quartz substrate is determined in light of the standing wave effect so as to use energy reflected off the patterned chromium layer as energy for forming the image on the wafer; moreover, the thickness of the quartz substrate is determined in consideration of the standing wave effect, and thereby increasing the exposure energy of light transmitted through the etched out portion of the patterned mask when a micro pattern is formed on the wafer. As a result, the exposure time decreases and the depth of the focus increases.

Although this invention has been described in its preferred form with a certain degree of particularity, those skilled in the art can readily appreciate that the present disclosure of the preferred form has been made only by way of example and that numerous changes in the details of the construction, combination and arrangement of parts may be resorted to without departing from the spirit and scope of the invention.

What is claimed is:

1. A method of manufacturing a mask for forming a pattern in a semiconductor device comprising the steps of:

sequentially forming a reflecting layer and a chromium layer on a quartz substrate;

depositing a photoresist layer on said chromium layer and patterning said photoresist layer;

etching said chromium layer and said reflecting layer by following the contours of said patterned photoresist layer;

etching an exposed portion of said quartz substrate, so that the following conditions being satisfied;

$$d \cdot \sin\theta = \tfrac{1}{4} \cdot (2n - 1) \cdot \lambda \qquad (1)$$

$$d' \cdot \sin\theta = \tfrac{1}{4} \cdot (2n) \cdot \lambda \qquad (2)$$

where, d is the thickness of said quartz substrate between said reflecting layer and the external boundary of the quartz substrate;

d' is the thickness of said quartz substrate at gaps between adjacent areas of said reflecting layer; and $\theta$ is the angle of reflection of reflected light;

$\lambda$ is a wavelength;

n is a positive number;

and removing said photoresist.

2. The method of claim 1, wherein said reflecting layer is made of aluminum.

3. The method of claim 1, wherein said reflecting layer is made of silver.

* * * * *